United States Patent
Furukawa et al.

(10) Patent No.: US 10,589,445 B1
(45) Date of Patent: Mar. 17, 2020

(54) METHOD OF CLEAVING A SINGLE CRYSTAL SUBSTRATE PARALLEL TO ITS ACTIVE PLANAR SURFACE AND METHOD OF USING THE CLEAVED DAUGHTER SUBSTRATE

(71) Applicant: Semivation, LLC, Fairfax, VT (US)

(72) Inventors: Toshiharu Furukawa, Essex Junction, VT (US); Mark Charles Hakey, Fairfax, VT (US); David Vaclav Horak, Essex Junction, VT (US); Peter H. Mitchell, Jericho, VT (US); William P. Parker, Waitsfield, VT (US); William R. Tonti, Greenland, NH (US)

(73) Assignee: Semivation, LLC, Fairfax, VT (US)

( * ) Notice: Subject to any disclaimer, the term of this patent is extended or adjusted under 35 U.S.C. 154(b) by 0 days.

(21) Appl. No.: 16/173,680

(22) Filed: Oct. 29, 2018

(51) Int. Cl.
  *B28D 5/00* (2006.01)
  *H01L 31/18* (2006.01)
  *B23K 26/53* (2014.01)

(52) U.S. Cl.
  CPC ............ *B28D 5/0011* (2013.01); *B23K 26/53* (2015.10); *H01L 31/1804* (2013.01); *H01L 31/184* (2013.01)

(58) Field of Classification Search
  CPC ..... B28D 5/0011; B23K 26/53; H01L 31/184; H01L 31/1804
  See application file for complete search history.

(56) References Cited

U.S. PATENT DOCUMENTS

| | | | | |
|---|---|---|---|---|
| 4,546,231 A * | 10/1985 | Gresser | ............ | B28D 1/221 |
| | | | | 219/121.72 |
| 6,992,026 B2 * | 1/2006 | Fukuyo | ............ | B23K 26/03 |
| | | | | 438/797 |
| 7,605,344 B2 * | 10/2009 | Fukumitsu | ............ | B23K 26/03 |
| | | | | 219/121.72 |
| 7,754,583 B2 * | 7/2010 | Sakamoto | ............ | B23K 26/16 |
| | | | | 438/463 |
| 8,431,467 B2 * | 4/2013 | Sakamoto | ............ | B28D 5/0011 |
| | | | | 438/463 |
| 2005/0202596 A1 * | 9/2005 | Fukuyo | ............ | B28D 1/221 |
| | | | | 438/113 |

(Continued)

*Primary Examiner* — John P. Dulka
(74) *Attorney, Agent, or Firm* — James Marc Leas

(57) ABSTRACT

A method of cleaving off a daughter single crystal substrate from a parent single crystal substrate includes providing a stress-mandrel and the parent a single crystal substrate. The parent single crystal substrate has a major surface and an edge surface that intersects the major surface. The major surface extends along a major surface plane. The stress-mandrel has a stress-mandrel coefficient of thermal expansion that is higher than the parent single crystal coefficient of thermal expansion. The method includes bonding the stress-mandrel to the major surface, and cooling the parent single crystal substrate and the stress-mandrel. The cooling of the parent single crystal substrate bonded to the stress-mandrel provides a thermal stress in the parent single crystal substrate sufficient to cleave the parent single crystal substrate. The cleaving extends substantially along a plane parallel to the plane of the major surface. In one embodiment the cleaved daughter substrate was used to make a photovoltaic cell.

21 Claims, 9 Drawing Sheets

(56) References Cited

U.S. PATENT DOCUMENTS

| | | | |
|---|---|---|---|
| 2007/0085099 A1* | 4/2007 | Fukumitsu | B23K 26/0884 257/98 |
| 2009/0008373 A1* | 1/2009 | Muramatsu | B28D 5/0011 219/121.85 |
| 2009/0117712 A1* | 5/2009 | Sakamoto | B28D 5/0011 438/463 |
| 2009/0166808 A1* | 7/2009 | Sakamoto | B28D 5/0011 257/618 |
| 2009/0250446 A1* | 10/2009 | Sakamoto | B28D 1/221 219/121.72 |
| 2009/0261083 A1* | 10/2009 | Osajima | B23K 26/073 219/121.72 |
| 2009/0302428 A1* | 12/2009 | Sakamoto | B28D 5/0011 257/620 |
| 2010/0006548 A1* | 1/2010 | Atsumi | B23K 26/046 219/121.72 |
| 2010/0009547 A1* | 1/2010 | Sakamoto | B28D 5/0011 438/795 |
| 2010/0012632 A1* | 1/2010 | Sakamoto | B23K 26/12 219/121.72 |
| 2010/0012633 A1* | 1/2010 | Atsumi | C03B 33/0222 219/121.72 |
| 2010/0025386 A1* | 2/2010 | Kuno | B23K 26/0853 219/121.67 |
| 2010/0184271 A1* | 7/2010 | Sugiura | C03B 33/0222 438/463 |
| 2010/0200550 A1* | 8/2010 | Kumagai | B28D 5/0011 219/121.72 |
| 2010/0240159 A1* | 9/2010 | Kumagai | B23K 26/0853 438/33 |
| 2010/0301521 A1* | 12/2010 | Uchiyama | B23K 26/0823 264/400 |
| 2010/0311313 A1* | 12/2010 | Uchiyama | B23K 26/0823 451/57 |
| 2011/0000897 A1* | 1/2011 | Nakano | B23K 26/046 219/121.67 |
| 2011/0001220 A1* | 1/2011 | Sugiura | B28D 5/0011 257/618 |
| 2011/0274128 A1* | 11/2011 | Fukumitsu | B23K 26/0736 372/38.1 |
| 2011/0303646 A1* | 12/2011 | Sakamoto | B28D 5/0011 219/121.72 |

* cited by examiner

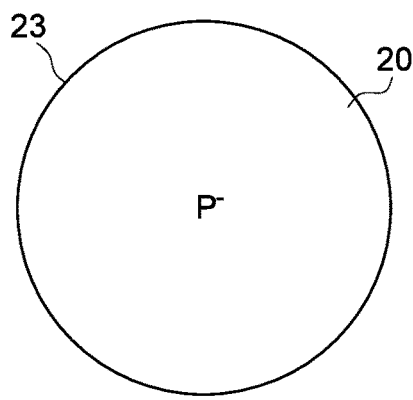
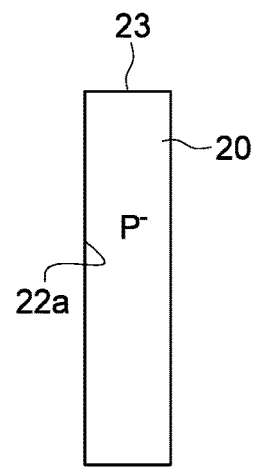
FIG. 1a          FIG. 1b
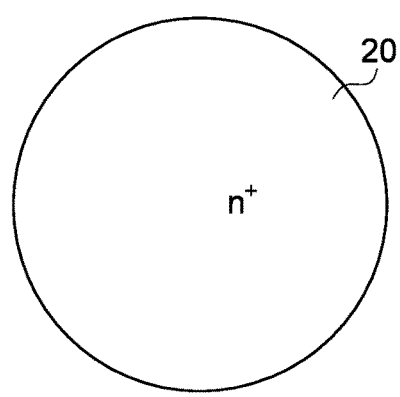
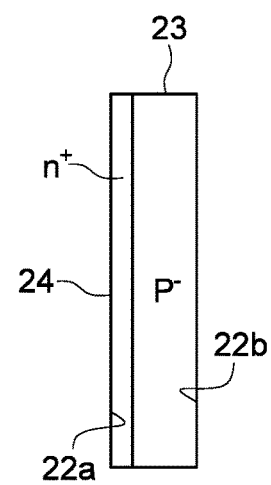
FIG. 2a          FIG. 2b
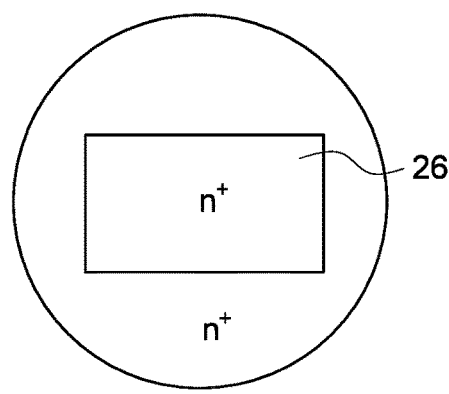
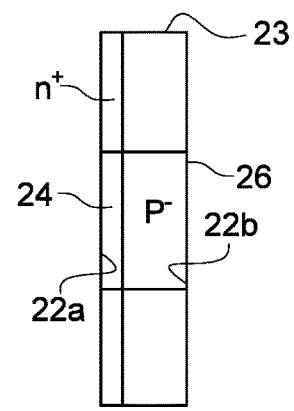
FIG. 3a          FIG. 3b

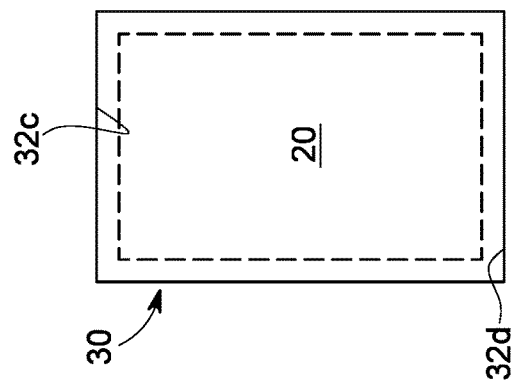
FIG. 4a
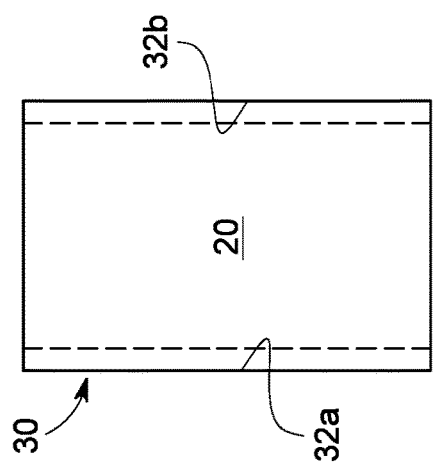
FIG. 4b
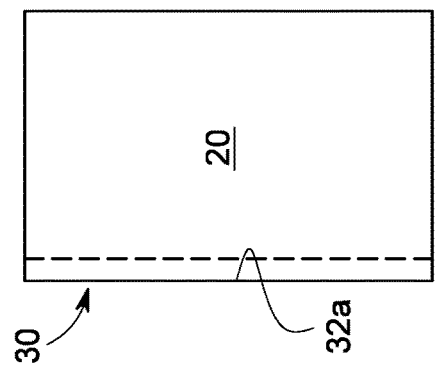
FIG. 4c
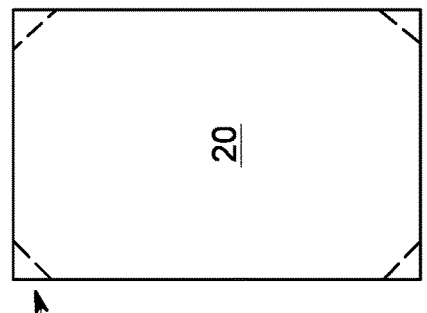
FIG. 4d
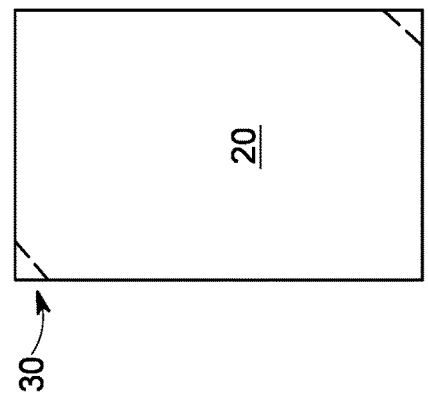
FIG. 4e
FIG. 4f

METHOD OF CLEAVING A SINGLE CRYSTAL SUBSTRATE PARALLEL TO ITS ACTIVE PLANAR SURFACE AND METHOD OF USING THE CLEAVED DAUGHTER SUBSTRATE

FIELD

This patent application generally relates to techniques for cleaving a single crystal substrate parallel to its active surface. More particularly, this application is related to techniques for cleaving a single crystal semiconductor wafer into two thinner wafers or cleaving a semiconductor wafer from a single crystal boule. More particularly, this patent application is related to techniques for using the single crystal semiconductor wafers so obtained to form semiconductor devices, such as solar cells.

BACKGROUND

Slicing single crystal semiconductor wafers from boules for integrated circuits and for solar cells has caused substantial waste of material in the saw blade kerf. Improvement has been needed to reduce the waste and avoid the cost, and such an improvement is provided by the current patent application.

SUMMARY

One aspect of the present patent application is a method of cleaving a single crystal substrate. The method includes providing a parent single crystal substrate. The parent single crystal substrate has a major surface and an edge. The major surface extends along a major surface plane the edge intersects the major surface. The method further includes providing a stress in the parent single crystal substrate. The stress is oriented in a direction to split the single crystal substrate substantially parallel to the major surface plane. The method further includes initiating cleaving of the parent single crystal substrate from the edge and extending the cleaving parallel to the major surface plane to provide a daughter single crystal substrate separate from the parent single crystal substrate. The daughter single crystal substrate includes the major surface and a cleaved surface. The cleaved surface extends along a cleaved surface plane that is substantially parallel to the major surface plane.

In one embodiment the parent single crystal substrate includes a single crystal semiconductor.

In one embodiment the single crystal semiconductor is a single crystal semiconductor wafer. In another it is a single crystal semiconductor boule.

The major surface may be flat or it may have a topology with peaks and valleys. The cleaved surface may have a topology with peaks and valleys.

In one embodiment the providing a stress in the parent single crystal substrate substantially parallel to the major surface plane includes applying a mechanical force perpendicular to the major surface plane.

In one embodiment the parent single crystal substrate has a parent single crystal substrate coefficient of thermal expansion and the providing of a stress in the parent single crystal substrate substantially parallel to the major surface plane includes providing a stress-mandrel. The stress-mandrel has a stress-mandrel coefficient of thermal expansion that is higher than the parent single crystal coefficient of thermal expansion. The method further includes bonding the stress-mandrel to the major surface and then cooling the parent single crystal substrate and the stress-mandrel sufficiently to initiate the cleaving of the parent single crystal substrate.

In one embodiment the bonding of the stress-mandrel to the major surface is accomplished at a temperature higher than room temperature.

In one embodiment the bonding includes anodic bonding.

In another embodiment the bonding is by way of epoxy bonding.

In one embodiment a cleavage initiation site is provided on the edge surface before the bonding.

In one embodiment the stress-mandrel is removed after the cleaving is complete.

In one embodiment an electronic device is formed on either the major surface or the cleaved surface or both.

In one embodiment the forming of an electronic device includes forming a p-n junction on the major surface before the initiating cleaving of the parent single crystal substrate.

BRIEF DESCRIPTION OF DRAWINGS

The foregoing and other aspects and advantages of the invention will be apparent from the following detailed description as illustrated in the accompanying drawings, in which:

FIG. 1a is a top view of a single crystal silicon wafer;

FIG. 1b is a cross sectional view of the single crystal silicon wafer of FIG. 1a;

FIG. 2a is a top view of a single crystal silicon wafer after an ion implantation step;

FIG. 2b is a cross sectional view of the single crystal silicon wafer of FIG. 2a;

FIG. 3a is a top view of a single crystal silicon wafer undergoing dicing to form coupons;

FIG. 3b is a cross sectional view of the single crystal silicon wafer of FIG. 3a;

FIGS. 4a-4f are top views of coupons with different embodiments of cleavage initiation slots;

DETAILED DESCRIPTION

Figure 5:
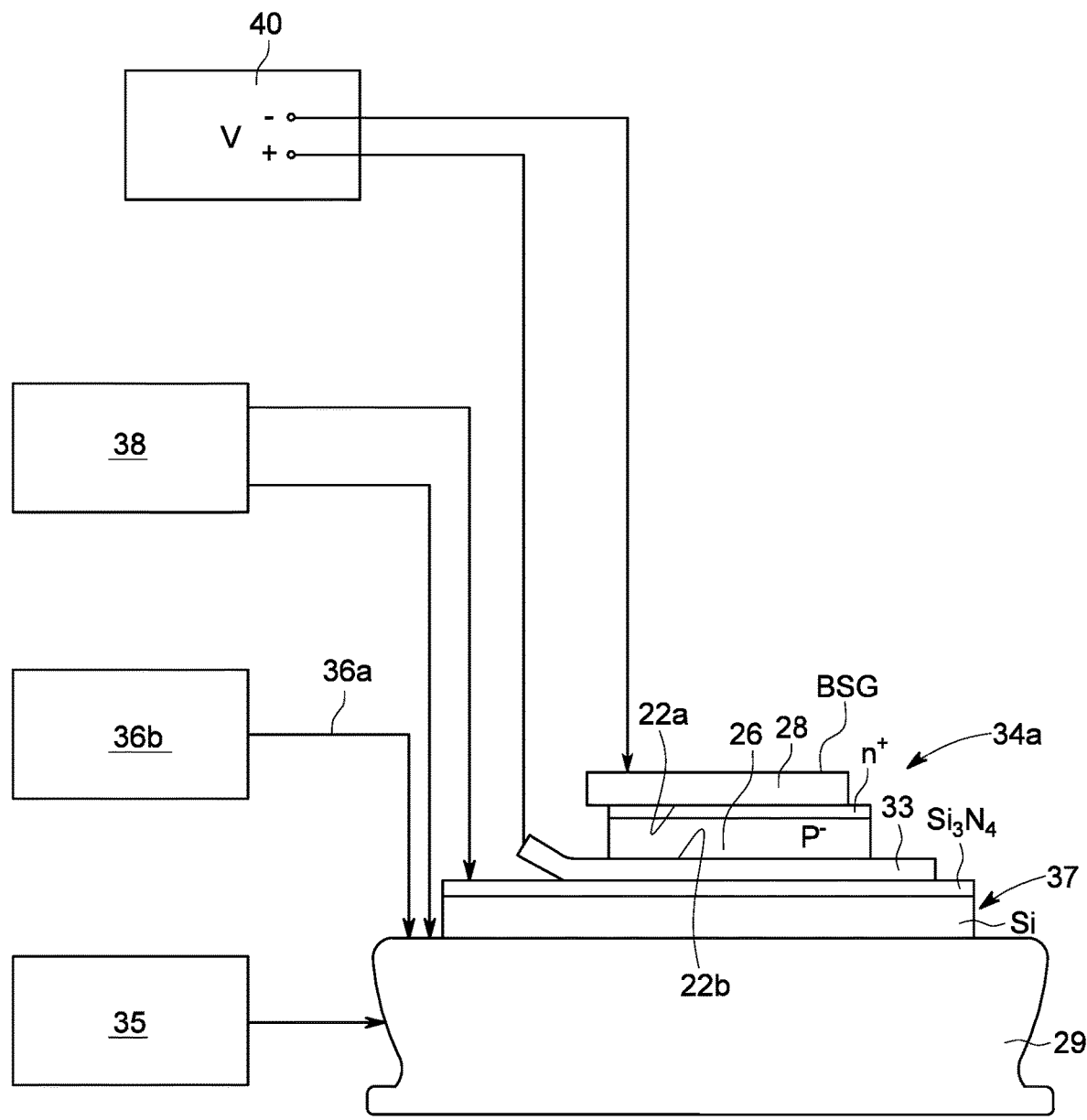
FIG. 5 is a cross sectional view of the stack of single crystal silicon coupon of FIGS. 3a, 3b and borosilicate glass plate (BSG) on a hot plate awaiting anodic bonding.

The present patent application provides a method of cleaving off a single crystal substrate parallel to its active planar surface that was discovered by the present inventors. The method includes providing a parent single crystal substrate and a stress-mandrel. The parent crystal substrate has a planar surface and an edge surface that intersects the planar surface. The stress-mandrel has a stress-mandrel coefficient of thermal expansion that is higher than the parent crystal coefficient of thermal expansion. The method includes bonding the stress-mandrel to the planar surface and cooling the parent crystal substrate and the stress-mandrel. The cooling of the parent crystal substrate bonded to the stress-mandrel provides a thermal stress in the parent crystal substrate because of the difference in thermal expansion coefficient. As the parent crystal substrate and stress-mandrel cool, cleaving of the parent crystal substrate begins at an edge surface when the cooling provides sufficient thermal stress in the parent crystal substrate at that location. The cleaving extends substantially along a plane parallel to the active planar surface.

In one embodiment a lightly doped single crystal wafer is used as starting material. The wafer may be a single crystal of a material, such as silicon or gallium arsenide. In one of the process steps, the wafer is split using a cleaving process, such as described herein below, and a solar cell is formed on each of the two thin cleaved portions.

In one experiment the starting material used was 100 mm diameter 500 um thick single crystal silicon wafer 20 with p-type impurities preferably in the range 1 to 10 ohm-cm and having a 100 crystal orientation, as shown in FIGS. 1a, 1b. Starting wafer 20 was double side polished item 775 purchased from University Wafer, Inc. South Boston, Mass. The oxygen content of starting wafer 20 is preferably less than 20 parts per million and without oxygen precipitations. In addition, starting material can be a single crystal boule. In one experiment, applicants successfully performed the cleaving process described herein below on an undiced single crystal semiconductor "boule" that was 10 mm thick and 50.8 mm in diameter For forming diffused region 24, planar surface 22a of wafer 20 was implanted with 31 phosphorus P+ ions at an energy of 100 KeV at 7 degrees with a dose of 2×10 E 15 using an ion implant machine at Cutting Edge Ions, LLC, Anaheim Calif., as shown in FIGS. 2a, 2b. Ion implanted arsenic can be substituted for the ion implanted phosphorus. Although in the experiment only one surface was implanted, for forming solar cells both daughter cells planar surfaces 22a and 22b would both be implanted. Alternatively, a standard high temperature diffusion process can be used for providing the heavily doped phosphorus n+ diffused regions 24 on both planar surfaces, 22a, 22b of wafer 20, and along edges 23 of wafer 20.

For the experiments, wafer 20 was then diced to provide coupons 26, each having a dimension of ½ inch by ¾ inch using a dicing saw at Kadco Ceramics in Easton, Pa., as shown in FIG. 3a, 3b. While dicing provided more substrates for varying conditions, the present inventors found that dicing is not necessary for cleaving.

In one experiment, a 220 um deep and 25 um wide cleavage initiation site (not shown) was formed in one or more edges of coupons by laser ablation with a Lumera Rapid 10 pico-second laser at 355 nm with 100 kHz repetition rate of pulses, each delivering 1 uJ, and aimed at a spot along the center of edges of each coupon. The laser ablating was performed at Photomachining Inc. in Pelham, New Hampshire. Other techniques for forming cleavage initiation site can be used, such as grinding, focused ion beam ablating, and chemical etching the edge surface.

Cleavage initiation site may have a depth in the range from 0.1 um to 1 mm More preferably in the range from between 0.1 um to 500 um. Cleavage initiation slot 30 may have a slot width in the range from 0.1 um to 1 mm, as shown in FIGS. 4a-4f. More preferably in the range from 0.1 um to 100 um.

Cleavage initiation slots may be formed along only one edge of a coupon. It may be formed on opposite sidewalls 32a, 32b, as shown in FIGS. 4a, 4b. It may be formed on all four sidewalls 32a-32d, as shown in FIG. 4c. Or, cleavage initiation slot 30 may be formed at one or more corners of rectangular crystal substrate 20, as shown in FIGS. 4d-4f.

However, in other experiments the present inventors found that cleavage initiation occurred on coupons that lacked a cleavage initiation site, and, therefore, that this process step could be omitted.

Coupons 26, both with and without cleavage initiation sites, were then ultrasonic cleaned in a solvent solution to remove particles left from dicing and/or cleavage initiation site formation. Coupons 26 were then subjected to a series of cleaning and rinsing steps standard for semiconductor processing. The first standard clean, called RCA1, of ammonium hydroxide/hydrogen peroxide/water 1:1:5 at 75° C. for 10 minutes was followed by a hot water rinse for 15 minutes. This was then followed by a second standard clean, called RCA2, of hydrochloric acid/hydrogen peroxide/water 1:1:6 at 75° C. for 10 minutes followed by hot water rinse for 15 minutes. This was followed by a piranha clean of sulfuric acid/hydrogen peroxide.

Next, coupons 26 were annealed at 1000° C. in nitrogen gas for 30 minutes to activate implanted phosphorus ions and to provide n+ diffused region 24 with a junction depth of 0.6 um, as also shown in FIG. 2b and FIG. 3b. In other experiments argon gas was used for the anneal.

In the next step borosilicate glass plate 28 (BSG) was placed on implanted and diffused planar surface 22a of coupon 26 on hot plate 29, as shown in FIG. 5, for anodic bonding, as described at en.wikipedia.org/wiki/Anodic bonding, dated May 14, 2016. A mechanical force, such as a weight or a spring loaded electrode is used to push BSG glass plate 28 and surface 22a of coupon 26 firmly together, providing a compressive force and holding stack 34a firmly together.

In some experiments, silicon nitride coated wafer 37 was provided on hot plate 29 to facilitate temperature uniformity across coupon 26. Titanium sheet 33 was provided on the nitride coated silicon wafer to enable electrical contact to bottom surface 22b of stack 34a that included BSG plate 28 and coupon 26. Using variable controller 35, temperature of hot plate 29 was ramped, as shown in FIG. 5, to 300° C. and up to 490° C. BSG plate 28 has a thermal coefficient of expansion closely matching that of silicon at about 3.0 E-6/° K.

Figure 6A:
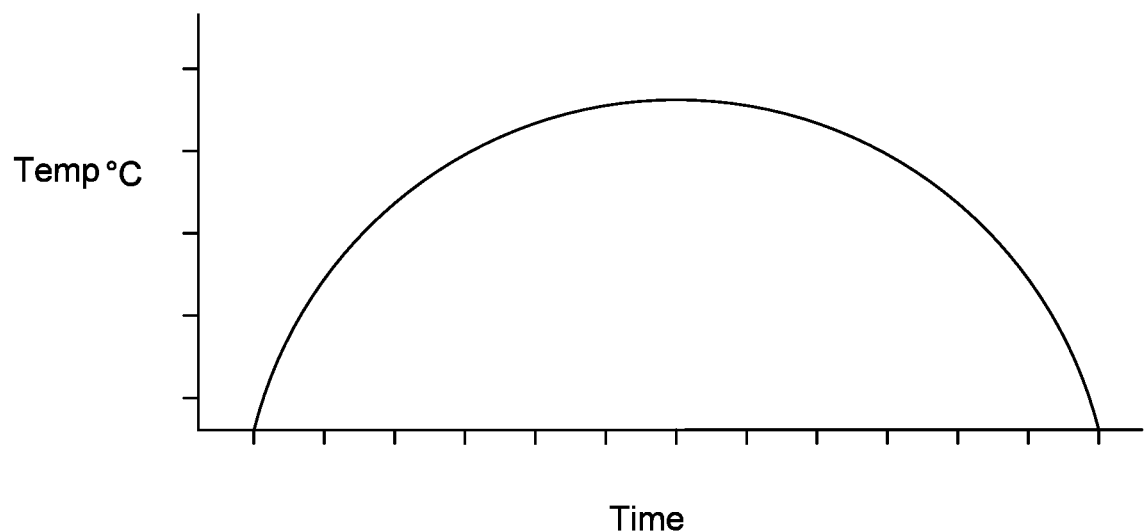
FIG. 6a is a graph showing how temperature of the stack of BSG plate and single crystal silicon coupon of FIG. 5 changed with time.
Figure 6B:
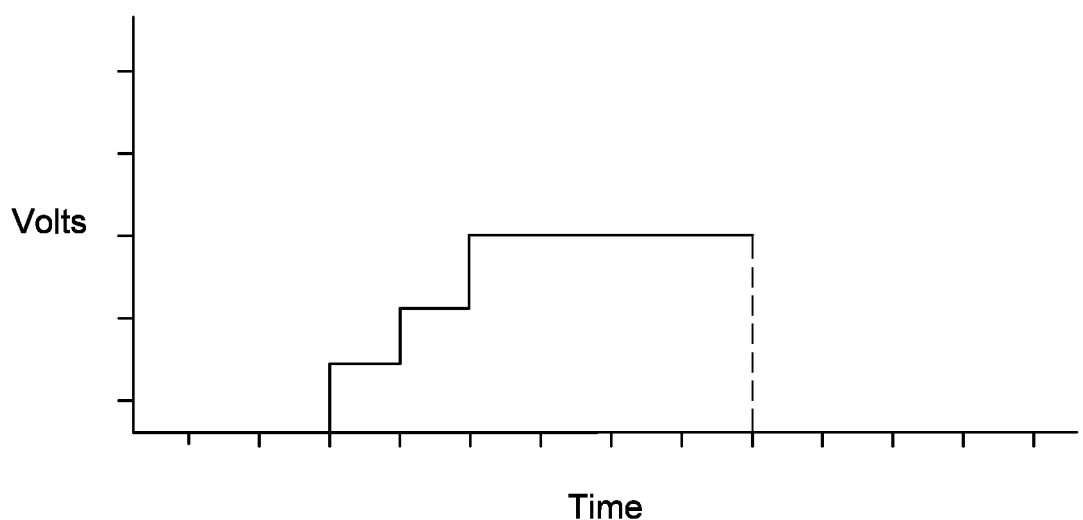
FIG. 6b is a graph showing how voltage across the stack of BSG plate and single crystal silicon coupon of FIG. 5 changed with time.

Once the desired temperature was reached, as indicated by meter 36b of thermocouple 36a or by pyrometer 38, voltage across stack 34a, provided by DC voltage source 40 contacting both titanium sheet 33 and BSG glass plate 28, was ramped in steps over a few seconds from 0 to 300V, as shown in FIGS. 6a, 6b. After 10 minutes the voltage was turned off and then hot plate 29 was allowed to cool, providing cooled stack 34a of BSG plate 28 anodically bonded to surface 22a of coupon 26.

Next, cooled stack 34a and 1 mm thick B270 glass plate 42 were subjected to standard cleaning steps.

Figure 7A:
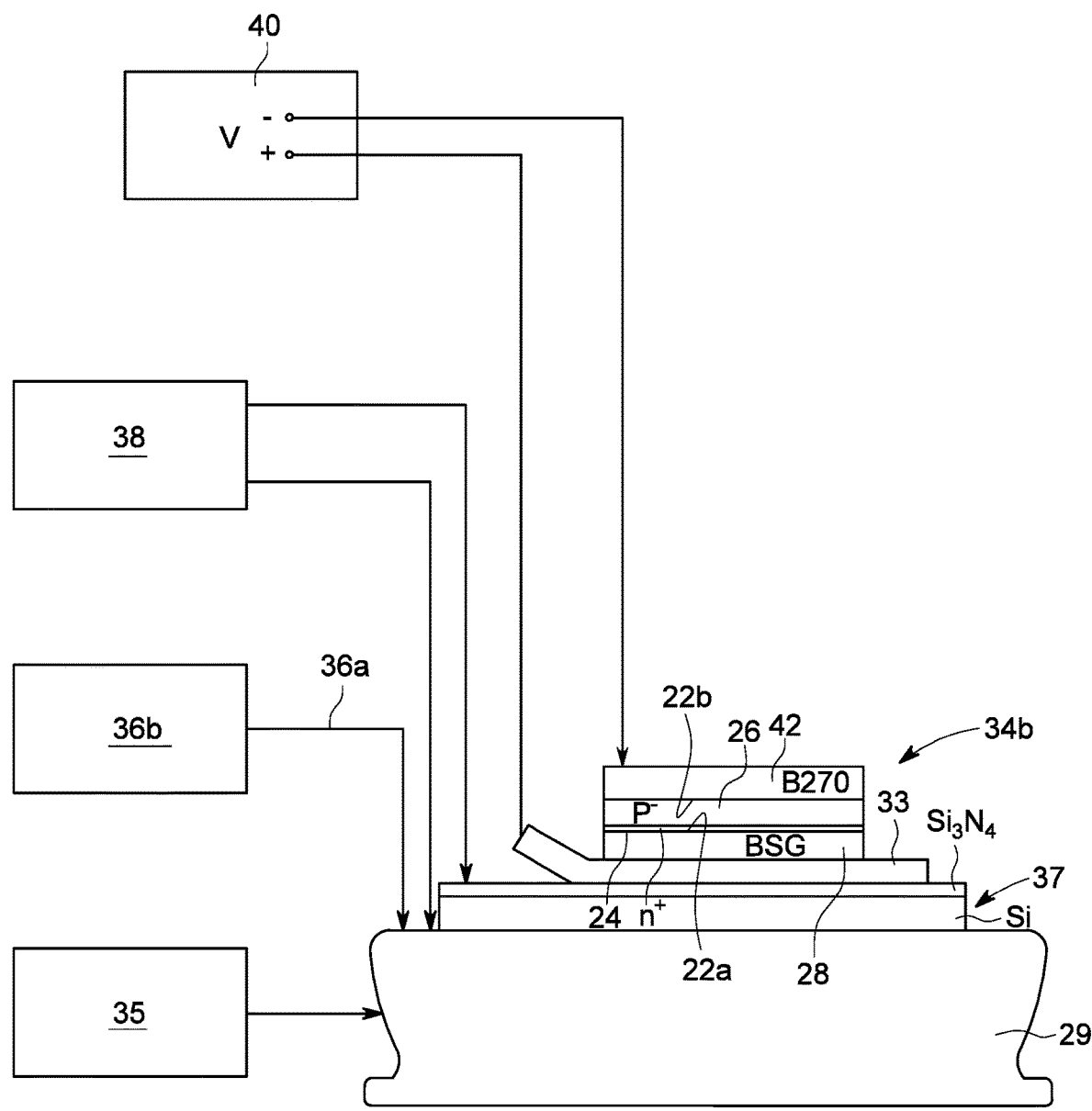
FIG. 7a is a cross sectional view of the stack of anodic bonded single crystal silicon coupon to BSG glass plate of FIG. 5 and B270 glass plate on a hot plate.

Next, cooled stack 34a was repositioned on hot plate 29 with exposed silicon planar surface 22b of coupon 26 now facing up and BSG glass plate 28 now contacting titanium sheet 33. B270 glass plate 42 was then placed on exposed silicon planar surface 22b, as shown in FIG. 7a. Temperature of hot plate 29 was then ramped to 470° C.

Once the 470° C. temperature was reached, voltage across stack 34b, provided by DC voltage source 40 contacting both titanium sheet 33 and B270 glass plate 42, was ramped to 300V for about 10 minutes to anodically bond B270 glass plate 42 to exposed silicon planar surface 22b of coupon 26, forming anodically bonded stack 34b, still at 470° C., as shown in FIG. 7a. An additional 10 minutes at temperature and voltage was used in some experiments to establish a stronger bond between B270 glass plate 42 and silicon planar surface 22b.

The thickness of the BSG glass plate 28 and of B270 glass plate 42 is between 0.050 mm and 5 mm, more preferably in the range between 0.1 mm and 1 mm. BSG glass plate 28, and B270 glass plate 42 have length and width the same as or larger than planar surfaces 22a, 22b of coupon 26. Prior to placing BSG glass plate 28 or B270 glass plate 42 on stack 34a, 34b, the glass plates are cleaned to remove any particulates.

Thus, anodically bonded stack 34b, included BSG glass plate 28 anodically bonded to silicon planar surface 22a of coupon 26 and B270 glass plate 42 anodically bonded to silicon planar surface 22b of coupon 26.

Some experiments varied peak hot plate temperature. For example in one experiment a peak hot plate temperature of 450° C. was used. Some experiments varied voltages applied across stack 34a, 34b. For example in one experiment a voltage of 250 V was used.

For larger surface areas, anodic bonding may be propagated across surface 22a, 22b by more complex arrangements of contacts to stack 34a, 34b. For example, several applied voltage and ground contacts may be provided to top and bottom surfaces of stacks 34a, 34b. Switches to these contacts may be sequentially closed, applying DC voltage to some while other switches remain open to apply voltage or ground only along center portions of glass plates 28, 42 or coupon 26 so current flows only in center portions and bonding of coupon 26 and glass plates 28, 42 starts from center portions of the coupon-glass plate interface. Wafer-glass plate bonding would then be propagated by applying the voltage progressively to outer contacts connected further from the center portion by closing more switches. However, applicants found that such anodic bonding propagation schemes were not necessary to obtain adequate cleavage parallel to coupon surfaces 22a, 22b.

B270 glass plate 42 has a substantially higher thermal coefficient of expansion, 9.9 E-6/° C., than silicon coupon 26, 3.0 E-6/° C. During the cooling, the present inventors anticipated that dimensions of B270 glass plate 42 would shrink substantially more than dimensions of silicon coupon 26 because of the difference in coefficient of thermal expansion. The difference in shrinkage during cooling would introduce thermal stress within coupon 26 to which B270 glass plate 42 was anodically bonded As cooling proceeds, inventors anticipated that the thermal stress would increase. When the thermal stress becomes sufficient, they anticipated that cleavage of silicon wafer 20 would start. Thus, the present inventors anticipated that cooling anodic bonded stack 34b from 470° C. to room temperature would provide substantial thermal stress in coupon 26 parallel to surfaces 22a, 22b as the dimension of B270 glass plate 42 shrunk substantially more than coupon 26.

Figure 7B:
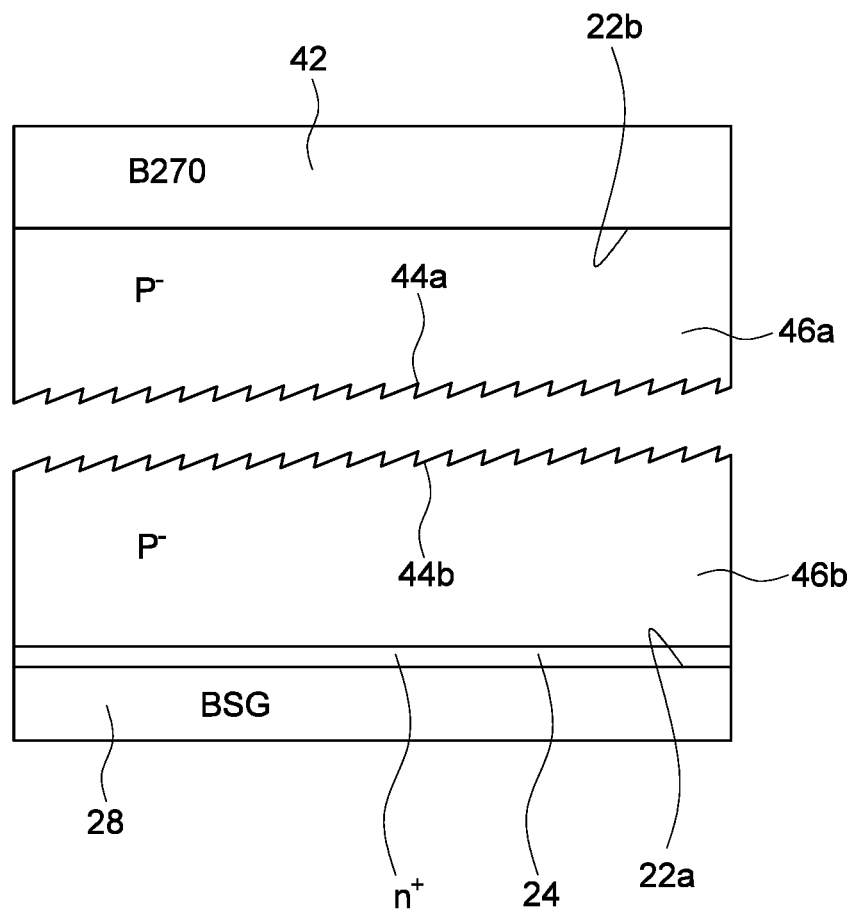
FIG. 7b is a cross sectional view of the two daughter single crystal silicon coupons produced when the single crystal silicon wafer of FIG. 7a has been cleaved.

In the experiment, hot plate 29 and bonded B270/Si/BSG stack 34b on hot plate 29 were then allowed to cool from 470° C. Cleavage of silicon coupon 26 parallel to surfaces 22a, 22b initiated from edge 23 when temperature fell, exposing cleaved surface 44a, 44b of daughter coupons 46a, 46b, as shown in FIG. 7b. The present inventors found that cleavage parallel to surfaces 22a, 22b occurred regardless of whether a cleavage initiation site had earlier been formed and regardless of whether a bonding propagation scheme was used.

Cleaved surfaces 44a, 44b were locally smooth although peak and valley topology was seen in some places. Peaks on cleaved surface 44a are matched by valleys in the corresponding locations of cleaved surface 44b, and vice versa, as shown in FIG. 7b. In experiments, cleavage of silicon coupon 26 initiated when temperature fell below about 95° C. and continued parallel to surfaces 22a, 22b as temperature continued to fall.

After further cleaning steps with standard cleans and 5% buffered HF for 10 seconds and a room temperature rinse, front and back contacts were formed for solar cells.

Figure 8:
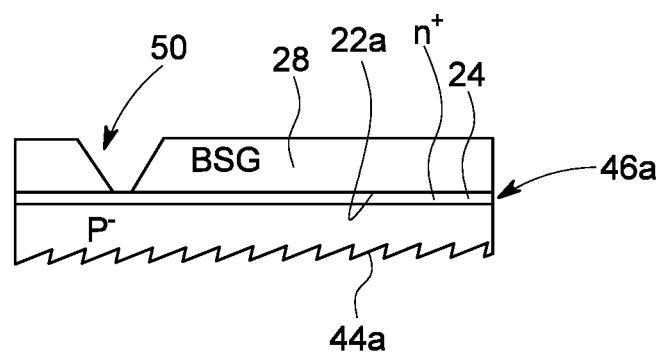
FIG. 8 is a cross sectional view of one of the daughter single crystal silicon coupons of FIG. 7b after aluminum evaporated on its cleaved surface, and contact opened through the anodically bonded BSG.

In one experiment, hole 50 through the 1 mm thick BSG glass 28 of daughter coupon 46a was partially ground and then daughter coupon 46a was dipped in dilute HF for contact to diffused region 24 on front surface 22a of daughter coupon 46a, as shown in FIG. 8. Masking and etching could also be used. While in the experiment, contact was made to only one spot on front surface of daughter coupon 46a, a typical solar cell array of grid lines can be formed to contact diffused region 24 and an anti-reflective coating deposited for improved solar cell efficiency. Conductive epoxy 51 was deposited in hole 50 for electrical contact to diffused region 24.

Figure 9:
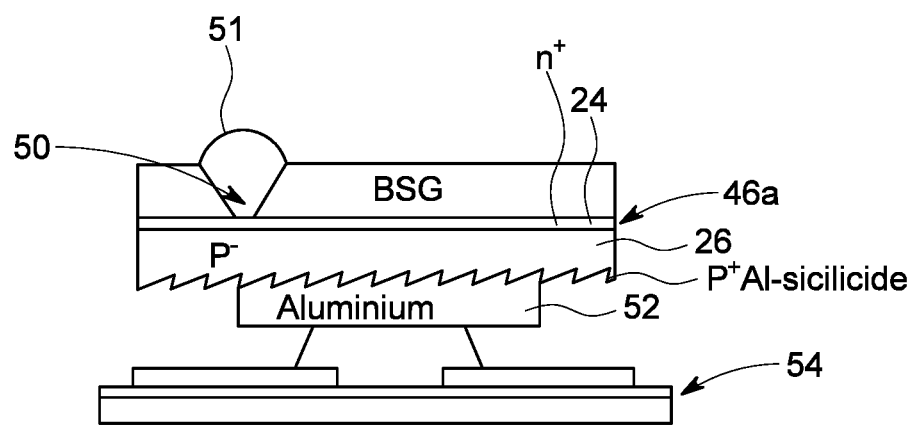
FIG. 9 is a cross sectional view of the daughter single crystal silicon coupon of FIG. 8 with contacts provided for test.

For contact to cleaved surface p– doped back surface 44a of daughter coupon 46a, aluminum 52 was evaporated to a thickness of 0.48 um, as shown in FIG. 9. Daughter coupon 46a was then annealed to drive in some of the aluminum to a depth of approximately 1 um and activate aluminum silicide so formed by ramping temperature to 500° C. in argon over 60 minutes followed by forming gas (10% $H_2$ and 90% $N_2$ gas mixture) flowing at 100 cc/minute for 30 minutes followed by ramping temperature down to 175° C. and then cooling to room temperature in argon.

The p+ aluminum diffusion in the p– substrate of coupon 26 provides reflection of light back into the silicon and provides a back surface electric field that reflects minority carriers generated deep in the silicon by long wavelength incident light back toward the p-n junction on the front surface, increasing collection of carriers and the efficiency of conversion of light to electricity.

Un-reacted aluminum 52 is left on cleaved silicon surface 44a as back surface electrical contact. With coupon 26 mounted on test stand 54, testing showed solar cell functionality.

Figure 10:
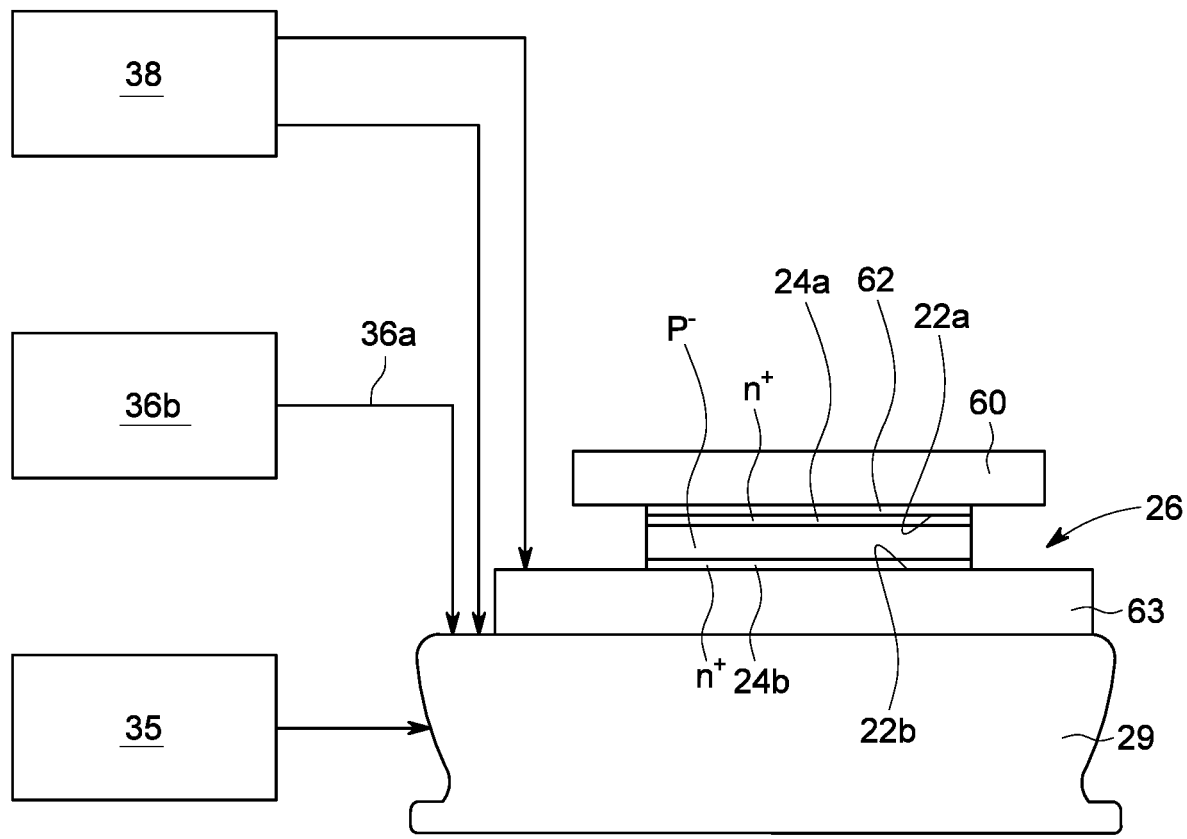
FIG. 10 is a cross sectional view of an alternative process in which a single crystal silicon coupon is epoxy bonded to a stress-mandrel having a high coefficient of thermal expansion on a hot plate.

Other experiments used other methods of providing stress parallel to surface 22a to facilitate cleavage propagation. In some, surface 22a of coupon 26 was bonded to a single ¼ inch thick aluminum plate 60 with epoxy 62, as shown in FIG. 10. In the experiments, epoxy 62 was Marineweld, available from J-B Weld, Sulphur Springs Texas. During the epoxy bonding, coupon 26 and aluminum plate 60 were held together with a pair of spring loaded clamps, such as used for holding a thick stack of paper, (not shown) and heated on 5 pound, 1 inch thick disk of iron 63 for 1 to 3 hours at a temperature in the range from 60° C. to 90° C. In another experiment, coupon 26 was bonded to a single aluminum right angle component (not shown).

Figure 11:
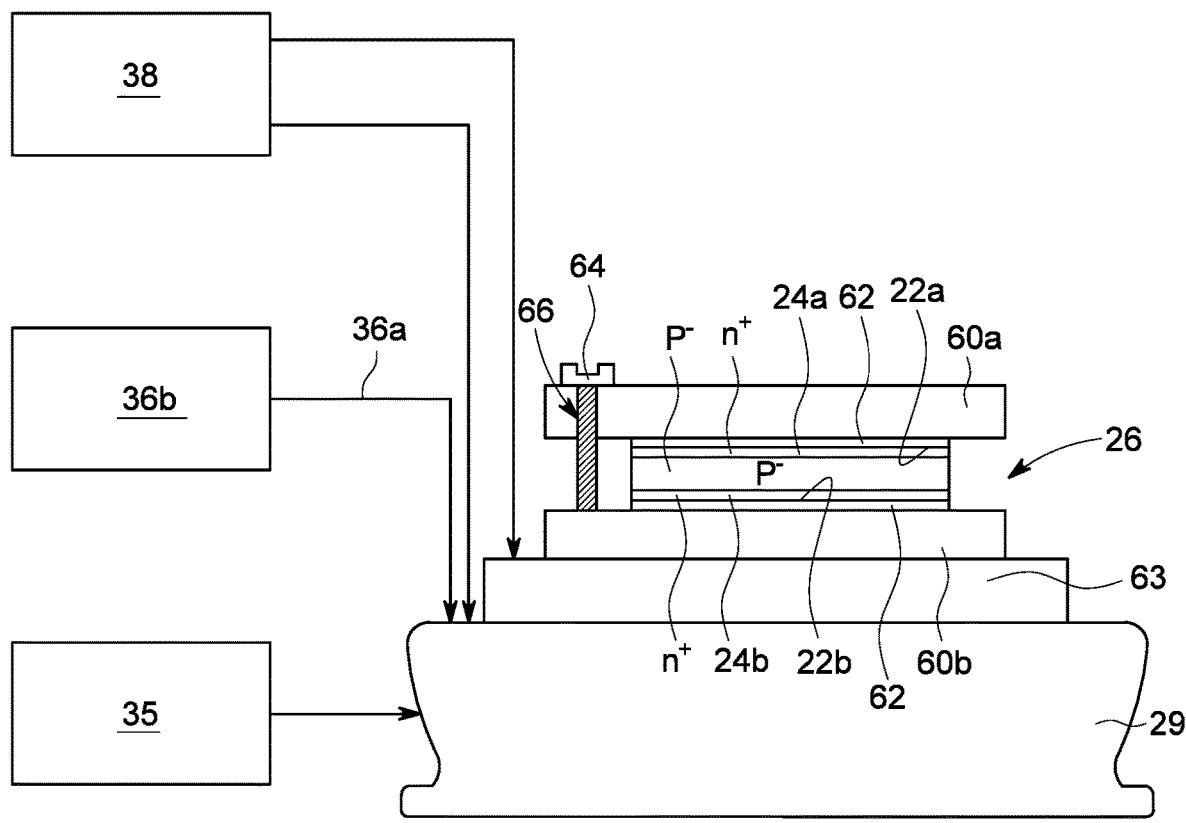
FIG. 11 is a cross sectional view of the alternative process of FIG. 10 in which mechanical pressure from a tightened screw adds stress to facilitate cleavage of the single crystal silicon coupon.

Although in the experiments that applicants performed with epoxy bonding the implant step was omitted and n+ diffusions 24a, 24b were not actually formed, the wafers could be implanted and such diffusions formed, and so the diffusions are shown in FIGS. 10 and 11. In some of the epoxy experiments, hot plate 29 was an electric frying pan. 5 pound, 1 inch thick disk of iron 63 was placed on the electric frying pan to provide greater thermal mass and greater thermal uniformity. Other thermally conductive materials, such as copper, can be used. In other experiments an oven was used for the heating.

In another experiment, coupon 26 was epoxy bonded between two aluminum plates 60a, 60b, as shown in FIG. 11. Each aluminum plate 60a, 60b was also ¼ inch thick. Applicants found that thicker plates provided adequate stiffness to provide the cleaving. After the epoxy bonding, cooling was provided from the 60° to 90° C. temperature range, and cleavage parallel to surfaces 22a, 22b of coupon 26 was observed before reaching room temperature.

The use of a material, such as epoxy for bonding allows the surface 22a of coupon 26 to have a topology, such as would be present if surface 22a was itself produced by the cleavage method of the present patent application. The epoxy bonding scheme thus allows wafers to be separated from boules of single crystal material sequentially without sawing.

Applicants designed a scheme for providing additional mechanical stress to cleave coupon 26 than could be provided by thermal stress alone, as shown in FIG. 11. In cases with two plates 60a, 60b a force provider, such as screw 64, positioned to provide a force between plates 60a, 60b, was turned to increase stress in coupon 26. Screw 64 was provided through tapped hole 66 in aluminum plate 60a to press against aluminum plate 60b, with aluminum plates 60a, 60b bonded to opposite planar surfaces 22a, 22b of coupon 26. Turning screw 64 applied a force perpendicular to aluminum plates 60a, 60b and to surfaces 22a, 22b of coupon 26. At elevated temperature, the stress all the way across coupon 26 could be increased depending on how much screw 64 was turned.

Without screw 64, thermal stress is maximum along edge regions of coupon 26 and declines to zero toward center regions of coupon 26. Screw 64 adds a stress level in center portions of coupon 26. Thus, cleavage across the central region of coupon 26—which otherwise would have zero stress from thermal expansion difference alone—is facilitated by screw 64. With a longer screw 64 the additional mechanical stress could be provided during cleavage of a wafer from a thicker coupon or wafer or from a boule.

While several embodiments, together with modifications thereof, have been described in detail herein and illustrated in the accompanying drawings, it will be evident that various further modifications are possible without departing from the scope of the invention as defined in the appended claims. Nothing in the above specification is intended to limit the invention more narrowly than the appended claims. The examples given are intended only to be illustrative rather than exclusive.

What is claimed is:

1. A method of cleaving a single crystal substrate comprising:
    a. providing a parent single crystal substrate, wherein said parent single crystal substrate has a major surface and an edge, wherein said major surface extends along a major surface plane and wherein said edge intersects said major surface;
    b. providing a stress in said parent single crystal substrate, wherein said stress is oriented in a direction to split said single crystal substrate substantially parallel to said major surface plane; and
    c. initiating cleaving of said parent single crystal substrate from said edge and extending said cleaving parallel to said major surface plane to provide a daughter single crystal substrate separate from said parent single crystal substrate, wherein said daughter single crystal substrate includes said major surface and a cleaved surface, wherein said cleaved surface extends along a cleaved surface plane that is substantially parallel to said major surface plane.

2. The method as recited in claim 1, wherein said providing a parent single crystal substrate includes providing a single crystal semiconductor.

3. The method as recited in claim 2, wherein said providing a single crystal semiconductor includes providing one from the group consisting of a single crystal semiconductor wafer and a single crystal semiconductor boule.

4. The method as recited in claim 3, wherein said daughter single crystal substrate includes a single crystal semiconductor wafer.

5. The method as recited in claim 1, wherein said major surface has a topology with peaks and valleys.

6. The method as recited in claim 1, wherein said cleaved surface has a topology with peaks and valleys.

7. The method as recited in claim 6, wherein said parent single crystal substrate has a parent single crystal substrate cleaved surface, wherein said parent single crystal substrate cleaved surface has parent single crystal substrate cleaved surface peaks and valleys, wherein said parent single crystal substrate cleaved surface peaks are matched by valleys in corresponding locations of said daughter single crystal substrate cleaved surface and vice versa.

8. The method as recited in claim 1, wherein said providing a stress in said parent single crystal substrate substantially parallel to said major surface plane includes applying a mechanical force perpendicular to said major surface plane.

9. The method as recited in claim 8, wherein said applying a mechanical force perpendicular to said major surface plane includes operating a force provider.

10. The method as recited in claim 9, wherein said mechanical force is applied to portions of said parent single crystal substrate that otherwise would have zero thermal stress.

11. The method as recited in claim 1, wherein said parent single crystal substrate has a parent single crystal substrate coefficient of thermal expansion, wherein said providing a stress in said parent single crystal substrate substantially parallel to said major surface plane includes:
    d. providing a stress-mandrel, wherein said stress-mandrel has a stress-mandrel coefficient of thermal expansion, wherein said stress-mandrel coefficient of thermal expansion is higher than said parent single crystal coefficient of thermal expansion;
    e. bonding said stress-mandrel to said major surface;
    f. cooling said parent single crystal substrate and said stress-mandrel sufficiently to initiate said cleaving of said parent single crystal substrate.

12. The method as recited in claim 11, wherein said stress-mandrel has a stiffness sufficient to support said cleaving.

13. The method as recited in claim 11, wherein said bonding said stress-mandrel to said major surface is accomplished at a temperature higher than room temperature.

14. The method as recited in claim 11, wherein said bonding includes at least one from the group consisting of anodic bonding and epoxy bonding.

15. The method as recited in claim 11, further comprising providing a cleavage initiation site on said edge surface before said bonding.

16. The method as recited in claim 11, further comprising removing said stress-mandrel after said cleaving is complete.

17. The method as recited in claim 11, further comprising forming an electronic device on at least one from the group consisting of said major surface and said cleaved surface.

18. The method as recited in claim 17, wherein said forming an electronic device includes forming a p-n junction on said major surface before said initiating cleaving of said parent single crystal substrate.

19. The method as recited in claim 18, wherein said electronic device includes a photovoltaic cell.

20. The method as recited in claim 11, wherein after said bonding step (e) and before said cooling step (f), applying additional mechanical stress to facilitate cleavage.

21. The method as recited in claim 1, wherein said parent single crystal substrate has a parent single crystal substrate coefficient of thermal expansion, wherein said providing a stress in said parent single crystal substrate substantially parallel to said major surface plane includes:

d. providing a stress-mandrel, wherein said stress-mandrel has a stress-mandrel coefficient of thermal expansion, wherein said stress-mandrel coefficient of thermal expansion is different from said parent single crystal coefficient of thermal expansion;

e. bonding said stress-mandrel to said major surface;

f. cooling said parent single crystal substrate and said stress-mandrel sufficiently to initiate said cleaving of said parent single crystal substrate.

* * * * *